United States Patent
MacKenthun

Patent Number: 6,073,855
Date of Patent: Jun. 13, 2000

[54] BYPASS INTERFACE FOR PCMCIA CARDS

[76] Inventor: Holger MacKenthun, 21 Blue Heron La., Downingtown, Pa. 19335

[21] Appl. No.: 09/111,321

[22] Filed: Jul. 7, 1998

[51] Int. Cl.[7] .................................................. G06K 19/06
[52] U.S. Cl. ........................................... 235/492; 235/380
[58] Field of Search ................................ 235/380, 375, 235/382, 382.5, 492, 486, 487

[56] References Cited

U.S. PATENT DOCUMENTS

| | | | |
|---|---|---|---|
| 4,454,414 | 6/1984 | Benton | 235/380 X |
| 5,375,037 | 12/1994 | Le Roux | 235/492 X |
| 5,434,395 | 7/1995 | Stork et al. | 235/380 |
| 5,608,607 | 3/1997 | Dittmer | 361/686 |
| 5,619,396 | 4/1997 | Gee et al. | 361/686 |
| 5,689,654 | 11/1997 | Kikinis et al. | 395/281 |
| 5,716,221 | 2/1998 | Kantner | 439/64 |
| 5,736,727 | 4/1998 | Nakata | 235/487 |
| 5,763,862 | 6/1998 | Jachimowicz et al. | 235/380 |

*Primary Examiner*—Karl D Frech
*Attorney, Agent, or Firm*—Imbre Balogh

[57] ABSTRACT

Mechanical/electronic apparatus for receiving, maintaining and transmitting information and data, the apparatus including a host computer and at least two PCMCIA cards parallelly positioned in a PCMCIA card compartment and having a communication interface between the PCMCIA cards. The communication interface can bypass the standard PCMCIA bus which connects PCMCIA cards to a host computer and thus accelerate the transmission of information and data. The information and data exchange may be performed by coupling the cards through capacitive coupling, optical coupling and inductive coupling.

25 Claims, 2 Drawing Sheets

BYPASS INTERFACE FOR PCMCIA CARDS

BACKGROUND OF THE INVENTION

1. Field of the Invention

The present invention relates to standardized cards according to the Personal Computer Memory Card International Association, hereinafter PCMCIA cards, having a new communication interface to exchange data with each other.

2. Reported Developments

The prior art provides a mechanical/electrical system and processes for PCMCIA type of cards to exchange data with each other through a new interface, whereby the standardized PCMCIA interface to a computer system may be bypassed.

PCMCIA cards are mechanical/electrical systems hat are being used in the computer industry to enhance a functionality of a computer. The industry has created standards for these cards that define the form, size, and data interfaces for connecting these cards to computer systems. PCMCIA cards have been defined for interfacing with computers. The external connections to other peripherals are designed according to manufacturer's specifications and applications.

A PCMCIA compartment holds the PCMCIA cards mechanically and connects the cards to a computer via numerous electrical contacts. A compartment can accommodate one or more PCMCIA cards which vertically and parallelly slide into the mechanical compartment. The cards connect to the PCMCIA interface of the computer. All data exchange between two PCMCIA cards has to be managed by the computer.

Some applications may require a fast exchange of data between two PCMCIA cards. Since the computer manages all data flow between the cards, the performance of the computer for other tasks may decrease and the data exchange between the cards may become slow. It appears that the market has only inadequate solutions and systems to this problem. The present invention will improve computer performance and data exchange rate between two PCMCIA cards.

SUMMARY OF THE INVENTION

The present invention is a mechanical/electronic apparatus of that nature of a PCMCIA card, which in addition to its standardized PCMCIA interfaces with a computer also comprises a bypass interface, which is capable of transmitting and receiving data between PCMCIA cards directly. Such interface can bypass the PCMCIA standard interface and can accelerate and improve applications. The data exchange and coupling between the cards may be performed with various technologies including: coupling with an electric field (capacitive coupling), coupling with optical transmitters and receivers (optical coupling) and magnetic field (inductive coupling).

In accordance with one aspect of the present invention, a mechanical/electronic apparatus of that nature of a PCMCIA card is provided with a new additional communication interface;

In another aspect, the present invention provides a method of communicating data between PCMCIA cards directly, whereby both cards can be removed from a PCMCIA compartment independently.

DETAILED DESCRIPTION OF THE PREFERRED EMBODIMENT

Figure 1:
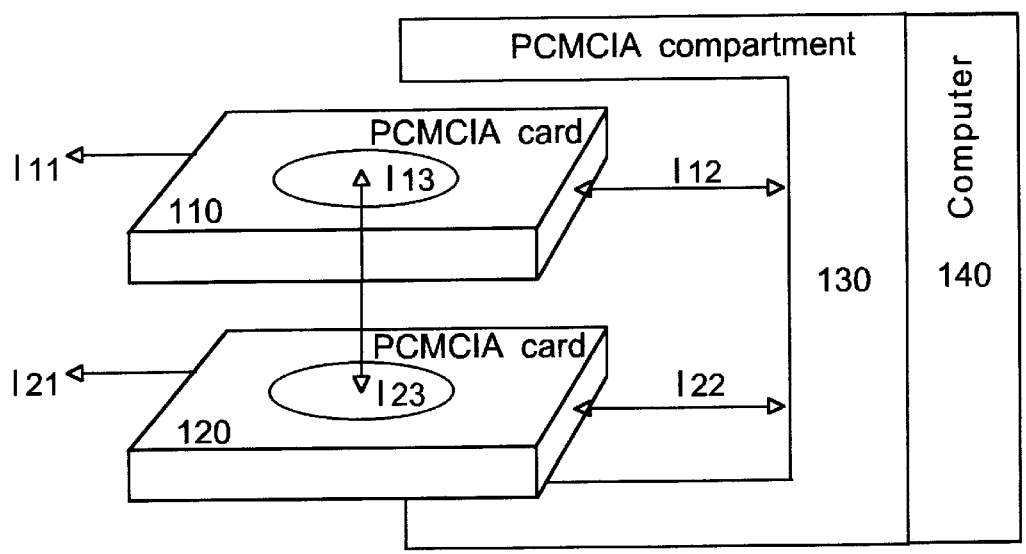
FIG. 1 is a prospective schematic view of two PCMCIA cards with bypass interfaces inserted into a PCMCIA compartment.

FIG. 1 shows two PCMCIA cards interfacing with a PCMCIA compartment of a personal computer. The personal computer 140 contains a PCMCIA compartment 130 with standardized PCMCIA interfaces I12 and I22 to PCMCIA cards 110 and 120. PCMCIA card 110 may have one or more interfaces I11 which can connect to other external systems such as computer peripherals, networks and phone lines. PCMCIA card 120 may be a similar card with one or more external interfaces I21. Data between I11 and I21 or between PCMCIA card 110 and PCMCIA card 120 can only be processed via the standard interfaces I12 and I22 whereby the personal computer 140 will manage the data exchange, This process is occupying processing power in the computer 140 and may slow the performance as well as the data exchange between PCMCIA card 110 and PCMCIA card 120.

When processing data between interface I11 and interface I21 or when data exchange between PCMCIA card is required, an additional bypass data interface is needed on a PCMCIA card in order to resolve this bottle neck problem. Such a bypass interface is introduced as I13 and I23 in FIG. 1. PCMCIA cards, which are equipped with such interfaces, can process data between PCMCIA card 110 and PCMCIA card 120 much quicker since the computer system 140 is bypassed.

The invention introduces a PCMCIA card with an additional electrical interface that can receive and transmit data between PCMCIA cards directly. Based on the invention, data can be processed via I13 and I23, whereby the standard PCMCIA interfaces I12 and I22 may be bypassed fully or partially. The bypass interfaces I13 and I23 are connected and are driven by the electronic circuitry of the PCMCIA cards. The PCMCIA compartment 130 of the computer system 140 is constructed in a way that multiple PCMCIA cards are in close proximity and parallelly. The new bypass interface I13 or I23 is taking advantage of this construction and provides an electrical bypass interface between the surfaces of the cards. The bypass interface between the PCMCIA cards will be operational when the cards are being inserted into the PCMCIA compartment. The PCMCIA cards may not be mechanically connected or attached to each other and can be inserted and removed independently from each other.

PCMCIA cards can be constructed with different bypass interfaces. The bypass interfaces can comprise of different coupling methods such as: electrical fields, optical paths and/or magnetic fields as follows.

Figure 2:
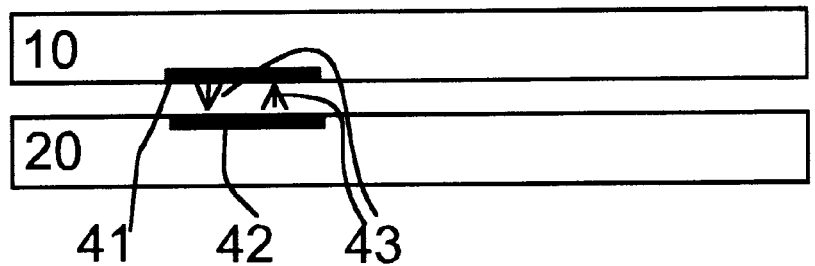
FIG. 2 is a side elevational schematics view of two PCMCIA cards with bypass interfaces having capacitive plates under the surfaces of the card for data exchange.

FIG. 2 shows two PCMCIA cards 10 and 20 with bypass interfaces. The bypass interfaces are realized through a coupling by an electric field 43 when both PCMCIA cards are inserted into a PCMCIA compartment. The electric field 43 is realized with plates 41 and 42 built in the cards. Multiple plates of 41 and 42 and paths can be implemented for multiple channels. The electric field coupling through the plates will is used to transmit and receive data between two PCMCIA cards.

Figure 3:
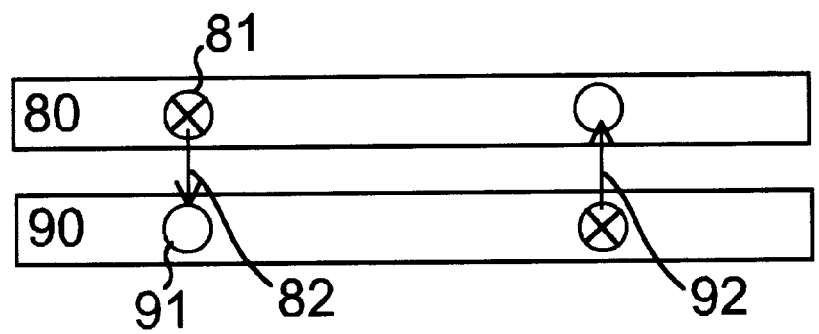
FIG. 3 is a side elevational schematics view of two PCMCIA cards with bypass interfaces having optical coupling for data exchange.

FIG. 3 shows two PCMCIA cards 80 and 90 with bypass interfaces. The bypass interfaces are realized with optical coupling when both PCMCIA cards are inserted into a PCMCIA compartment. Each transmission path is realized by a transmitter 81 and a receiver 91. For a full duplex transmission a minimum of two transmission paths 82 and 92 are required. Data are transmitted by an optical signal between the cards.

Figure 4:
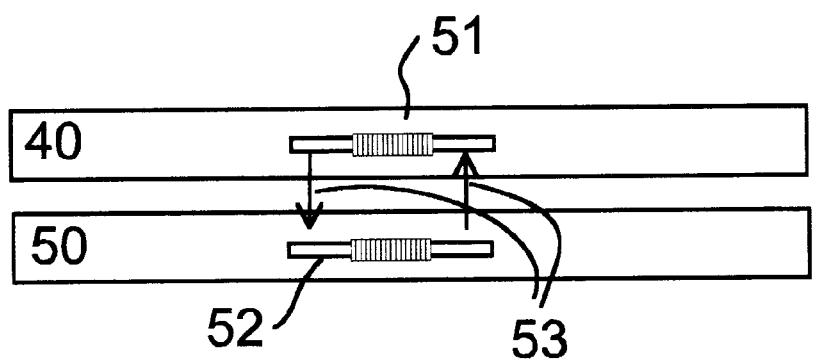
FIG. 4 is a side elevational schematics view of two PCMCIA cards with bypass interfaces having inductive coupling for data exchange.

FIG. 4 shows two PCMCIA cards 40 and 50 with bypass interfaces. The bypass interfaces are realized by inductive coupling 53 when both PCMCIA cards are inserted into a PCMCIA compartment. The numerals 51 and 52 represent the inductive coupling elements. It is possible to implement multiple pairs of these coupling elements for a better data transmission. The inductive coupling 53 may also provide power for one PCMCIA card.

The electrical field, optical signal and magnetic field couplings are well known to those skilled in the art.

Example of a working model:

Referring to FIG. 1 PCMCIA card 110 may be a networking PCMCIA card connecting a LAN, (local area network) or WAN, (wide area network), at its interface I11 to the computer 140 via the PCMCIA compartment 130. Data at I11 are processed encrypted. PCMCIA card 120 may be a PCMCIA card which holds the encryption keys and can encrypt and decrypt data from I11. Therefore, PCMCIA card 110 and PCMCIA card 120 have to establish a communication. In a conventional solution, the two PCMCIA cards would have to exchange their data through the computer 140 via the interfaces I12 and I22. This process would slow the performance of the computer system since the computer would have to manage the data exchange and parts of the encryption process. However, in this application it is not necessary to involve the computer system, because only the two PCMCIA cards have to exchange data with each other before passing it on to the computer.

Subject to the invention is an improved version of PCMCIA cards, whereby PCMCIA card 110 and PCMCIA card 120 is equipped with a bypass interface. Data from and to I11 can be processed by the electronics of both PCMCIA cards via the bypass interfaces I13 and I23. Incoming data at I11 are received from PCMCIA card 110 and will be forwarded to the electronics of PCMCIA card 120 via the bypass interfaces I13 and I23. The electronics of PCMCIA card 120 will receive the data and will apply its calculation for decrypting the data.

Scenario a: The decrypted data in PCMCIA card 120 will be transmitted back to PCMCIA card 110 via the bypass interfaces I23 and I13 so that PCMCIA card 110 can forward the decrypted data to the computer system 140 via interface I12.

Scenario b: The decrypted data in PCMCIA card 120 will be forwarded directly to the computer system 140 via interface I22.

In both scenarios the computer system 140 will not be involved in the decryption process and will only receive the decrypted data. The decryption process can be performed faster and the computer system performance is freed for other tasks.

Data transmission from the computer system 140 to I11 will work vice-versa to the above-described process. The computer system transits decrypted information to PCMCIA card 120 via interface I22. Alternatively the computer can also send the decrypted information via interface I12 to PCMCIA card 110, which forwards the information to PCMCIA card 120 via the bypass interfaces I13 and I23. PCMCIA card 120 holds the encryption keys and encrypts the information received from I22 or I13 or I23. The encrypted information is then sent to the networking PCMCIA card 110, which transmits the information to I11 into the LAN network.

Some systems may offer PCMCIA card 110 and PCMCIA card 120 in one card combined. However, the advantage of the present invention is that cards can be inserted and removed independently. In this example, when removing the access card PCMCIA card 120 from the computers the computer remains connected to the network and may perform only basic networking functions, while the secure data encryption and decryption is cut off and disabled.

What is claimed is:

1. A mechanical/electronic apparatus for receiving, maintaining and transmitting information and data comprising:

a host computer having a PCMCIA card receiving compartment; and at least two PCMCIA cards parallelly positioned in said PCMCIA compartment, in close proximity to each other having a bypass interface therebetween, said PCMCIA cards being capable of receiving, maintaining and transmitting information and data contactless by said bypass interface therebetween.

2. The mechanical/electronic apparatus of claim 1 wherein said bypass interface is on the inside or on the surface of said PCMCIA cards.

3. The mechanical/electronic apparatus of claim 1 wherein the PCMCIA cards can be inserted and removed independently from each other in the PCMCIA card receiving compartment and can transmit data via their bypass interfaces.

4. The mechanical/electronic apparatus of claim 1 wherein the bypass interface in said PCMCIA cards is achieved by coupling the cards with an electric field therebetween.

5. The mechanical/electronic apparatus of claim 1 wherein the bypass interface in said PCMCIA cards is achieved by coupling the cards with optical transmission paths therebetween.

6. The mechanical/electronic apparatus of claim 1 wherein the bypass interface in said PCMCIA cards is achieved by coupling the cards with magnetic fields therebetween.

7. The mechanical/electronic apparatus of claim 1 wherein the bypass interface in said PCMCIA cards is achieved by coupling an operational power from one to another card by a magnetic field therebetween.

8. A mechanical/electronic apparatus for receiving, maintaining and transmitting information and data comprising:

a) a computer capable of receiving, analyzing, maintaining and transmitting information and data; said computer having a PCMCIA card receiving compartment; and b) at least two PCMCIA cards inserted into said PCMCIA card receiving compartment of said computer parallel to each other without physical contact therebetween, wherein both of said PCMCIA cards containing a bypass interface and being capable of receiving, maintaining and transmitting information and data to each other and to said computer whereby said information and data can bypass said computer partially or completely.

9. The mechanical/electronic apparatus of claim 8 wherein said PCMCIA cards may receive, maintain and transmit to each other and to said computer and to external systems encrypted and decrypted information and data.

10. The mechanical/electronic apparatus of claim 8 wherein said information and data are received by said PCMCIA cards from external sources.

11. The mechanical/electronic apparatus of claim 8 wherein said information and data are received by said PCMCIA cards from said computer.

12. The mechanical/electronic apparatus of claim 8 wherein said information and data are pre-inputed in said PCMCIA cards.

13. The mechanical/electronic apparatus of claim 8 wherein the PCMCIA cards can be inserted and removed independently from each other in the PCMCIA card receiving compartment and can transmit data via their bypass interfaces.

14. The mechanical/electronic apparatus of claim 8 wherein the bypass interface in said PCMCIA cards is achieved by coupling the cards with an electric field therebetween.

15. The mechanical/electronic apparatus of claim 8 wherein the bypass interface in said PCMCIA cards is achieved by coupling the cards with optical transmission paths therebetween.

16. The mechanical/electronic apparatus of claim 8 wherein the bypass interface in said PCMCIA cards is achieved by coupling the cards with magnetic fields therebetween.

17. The mechanical/electronic apparatus of claim 8 wherein the bypass interface in said PCMCIA cards is achieved by coupling an operational power from one to another card by a magnetic field therebetween.

18. A method for receiving and transmitting information and data via a bypass interface between two or more PCMCIA cards comprising the steps of:

provinding a computer having a PCMCIA card receiving compartment, and parallelly positioning two or more PCMCIA cards into said PCMCIA card compartment and providing a bypass interface between said cards without physical contact.

19. The method of claim 18 wherein said PCMCIA cards can be inserted and removed independently from each other in the PCMCIA card receiving compartment and can transmit information and data via their bypass interfaces.

20. The method of claim 18 wherein said bypass interface in said PCMCIA cards is achieved by coupling the cards with an electric field therebetween.

21. The method of claim 18 wherein said bypass interface in said PCMCIA cards is achieved by coupling the cards with optical transmission paths therebetween.

22. The method of claim 18 wherein said bypass interface in said PCMCIA cards is achieved by coupling the cards with magnetic fields therebetween.

23. The method of claim 18 wherein said bypass interface in said PCMCIA cards is achieved by coupling an operational power from one to another card by a magnetic field therebetween.

24. A method for receiving analyzing maintaining and transmitting information and data, decrypting information and data and transmitting said information and data between two or more PCMCIA cards and a computer containing said cards comprising the steps of:

(A) providing a computer having a PCMCIA card receiving compartment and is capable of receiving, analyzing, maintaining and transmitting information and data; and at least two PCMCIA cards insertable into said PCMCIA receiving compartment of said computer parallel to each other without physical contact therebetween, wherein both of said PCMCIA cards containing a bypass interface and being capable of receiving and transmitting information and data whereby said information and data can bypass said computer partially or completely;

(B) providing information and data to said PCMCIA cards;

(C) allowing said cards to exchange said information and data and transmit said information and data to said computer; and (D) allowing said computer to process, maintain and provide said information and data to a requester thereof.

25. A method for receiving, analyzing, maintaining and transmitting information and data between two or more PCMCIA cards and a computer containing said cards comprising the steps of:

(A) providing a computer having a PCMCIA card receiving compartment and is capable of receiving, analyzing, maintaining and transmitting information and data; and at least two PCMCIA cards insertable into a PCMCIA receiving compartment of said computer parallel to each other without physical contact therebetween, wherein both of said PCMCIA cards containing a bypass interface and being capable of receiving and transmitting information and data to each other and to said computer whereby said information and data can bypass said computer partially or completely;

(B) connecting a network to said computer through the bypass interface of said PCMCIA cards;

(C) inputting information and data into said PCMCIA cards from said network;

(D) allowing information and data exchange between said PCMCIA cards and having said PCMCIA card process said information and data;

(E) allowing said PCMCIA cards to transmit said information and data to said computer;

(F) allowing said computer to process and maintain said information and data; and (G) having said computer output said processed information and data to a requester thereof.

* * * * *